United States Patent
Nagel et al.

(10) Patent No.: US 9,196,763 B2
(45) Date of Patent: Nov. 24, 2015

(54) EFFICIENT LIGHT EXTRACTION FROM WEAKLY-COUPLED DIELECTRIC BUTTES

(71) Applicant: Terahertz Device Corporation, Salt Lake City, UT (US)

(72) Inventors: James R. Nagel, Provo, UT (US); Mark S. Miller, Salt Lake City, UT (US)

(73) Assignee: Terahertz Device Corporation, Salt Lake City, UT (US)

( * ) Notice: Subject to any disclaimer, the term of this patent is extended or adjusted under 35 U.S.C. 154(b) by 0 days.

(21) Appl. No.: 14/528,751

(22) Filed: Oct. 30, 2014

(65) Prior Publication Data
US 2015/0115221 A1  Apr. 30, 2015

Related U.S. Application Data

(60) Provisional application No. 61/987,748, filed on Oct. 30, 2013.

(51) Int. Cl.
| | |
|---|---|
| *H01L 29/06* | (2006.01) |
| *H01L 31/0232* | (2014.01) |
| *H01L 31/0304* | (2006.01) |
| *H01L 31/0352* | (2006.01) |
| *H01L 33/44* | (2010.01) |
| *H01L 33/06* | (2010.01) |
| *H01L 33/30* | (2010.01) |
| *H01L 33/22* | (2010.01) |
| *H01L 33/40* | (2010.01) |

(52) U.S. Cl.
CPC ...... *H01L 31/02327* (2013.01); *H01L 31/0304* (2013.01); *H01L 31/035236* (2013.01); *H01L 33/44* (2013.01); *H01L 33/06* (2013.01); *H01L 33/22* (2013.01); *H01L 33/30* (2013.01); *H01L 33/405* (2013.01); *H01L 2933/0083* (2013.01); *H01L 2933/0091* (2013.01)

(58) Field of Classification Search
CPC ............... H01L 2924/00; H01L 2924/0002; H01L 33/62; H01L 33/32; H01L 33/50; H01L 33/58; H01L 33/60; H01L 51/56; H01L 27/156; H01L 33/005; H01L 33/0075; H01L 33/06; H01L 33/24; H01L 33/42
USPC .......... 257/98–99, E33.008, E33.068; 438/22
See application file for complete search history.

(56) References Cited

U.S. PATENT DOCUMENTS

| | | |
|---|---|---|
| 5,779,924 A | 7/1998 | Krames et al. |
| 7,053,419 B1 | 5/2006 | Camras et al. |

(Continued)

OTHER PUBLICATIONS

I. Schnitzer, et al., "30 % quantum efficiency from surface textured, thin-film light-emitting diodes," Applied Physics Letters, vol. 63, No. 16, pp. 2174-2176, 1993.

(Continued)

*Primary Examiner* — Mark A Laurenzi
(74) *Attorney, Agent, or Firm* — Kunzler Law Group

(57) ABSTRACT

A light emitting diode (LED) with weakly-coupled dielectric buttes deposited along the surface is disclosed. The buttes improve light extraction from a distributed volume of incoherent sources in a high-index substrate, as well as from light backscattered by a rear metallic contact. A lattice arrangement for the buttes maximizes area coverage, subject to the constraint of weak evanescent wave coupling between them. The butte distribution may be fabricated by epitaxial deposition above a current spreading layer, followed by photolithographic patterning and etching.

18 Claims, 3 Drawing Sheets

(56) References Cited

U.S. PATENT DOCUMENTS

| | | |
|---|---|---|
| 7,294,862 B2 | 11/2007 | Wierer, Jr. et al. |
| 2008/0121918 A1 | 5/2008 | DenBaars et al. |
| 2008/0128728 A1* | 6/2008 | Nemchuk et al. .............. 257/98 |
| 2009/0121250 A1 | 5/2009 | DenBaars et al. |
| 2014/0291715 A1* | 10/2014 | Reiherzer et al. ............. 257/98 |

OTHER PUBLICATIONS

J. Wierer, et al., "InGaN/GaN quantum-well heterostructure light-emitting diodes employing photonic crystal structures," Applied Physics Letters, vol. 84, No. 19, pp. 3885-388, 2004.

J. Nagel, "Light extraction by directional sources within optically dense media," Optics Express, vol. 20, No. 25, pp. 27530-27541, 2012.

A. David, et al. "Optimization of light-diffraction photonic-crystals for high extraction efficiency LEDs," Journal of Display Technology, vol. 3, No. 2, pp. 133-148, 2007.

C. Wiesmann, et al., "Photonic crystal LEDs—designing light extraction," Laser & Photonic Reviews, vol. 3, No. 3, pp. 262-286, 2009.

C. Lai, et al., "Polarized light emission from photonic crystal light-emitting diodes," Applied Physics Letters, vol. 92, No. 24, pp. 243118-243120, 2008.

E. Yablonovitch, "Statistical ray optics," Journal of the Optical Society of America, vol. 72, No. 7, pp. 899-907, 1982.

* cited by examiner

EFFICIENT LIGHT EXTRACTION FROM WEAKLY-COUPLED DIELECTRIC BUTTES

CROSS-REFERENCE TO RELATED APPLICATIONS

This application claims the benefit of U.S. provisional application 61/897,748 entitled "Efficient Light Extraction from Weakly-Coupled Dielectric Buttes" and filed on 30 Oct. 2013. The foregoing application is incorporated herein by reference.

BACKGROUND

1. Technical Field

The subject matter disclosed herein relates generally to optoelectronic devices, and in particular to light extraction from optoelectronic devices.

2. Discussion of the Background

Light emitting diodes (LEDs) are a class of optoelectronic devices that convert electrical energy into radiant light. Typical LED structures are comprised of doped semiconductor layers placed into contact with each other to create a p-n junction. As electrical current is driven through the junction, electrons and holes recombine with each other and emit photons. The energy in each photon is then determined by the energy difference between electrons and holes in their respective energy bands. The mean energy of the photons (or equivalently, the frequency and wavelength) may therefore be engineered by carefully manipulating the band structure within the junction.

One of the major obstacles against high-efficiency LEDs is the problem of light extraction. Because the index of refraction for so many semiconductor materials is relatively high (e.g., index of refraction n>2.5), the escape cone with respect to the ambient environment is generally very narrow (e.g., an escape cone angle $\theta_c$<20 degrees). When a ray of light strikes a planar interface beyond the escape cone angle, the result is a phenomenon called total internal reflection (TIR), wherein virtually all incident energy is reflected back down into the substrate. Consequently, a large majority of photons from an LED are needlessly converted into waste heat rather than freely radiated out into the ambient environment. Without proper light extraction techniques integrated into the design, the overall efficiency of a typical LED is limited to the range of only 2-5%.

SUMMARY OF THE INVENTION

The present invention has been developed in response to the present state of the art, and in particular, in response to the problems and needs in the art that have not yet been fully solved by currently available light extraction structures.

As disclosed herein, an optoelectronic device, in certain embodiments, includes a substrate, at least one junction configured to provide an active region within the substrate, a metallic back contact, a collection of dielectric buttes disposed on a top surface of the substrate, wherein the collection of dielectric buttes are spaced to substantially maximize light extraction over an operating wavelength range for the junction. The collection of dielectric buttes may have a median gap between the buttes that provides weak evanescent coupling between the buttes. For example, the median gap may be between 0.1 and 0.5 wavelengths. In some embodiments, the median gap is between 0.15 and 0.30 wavelengths. Preferably, the dielectric buttes have a median width that is greater than 0.25 wavelengths and less than 2.0 wavelengths.

It should be noted that references throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
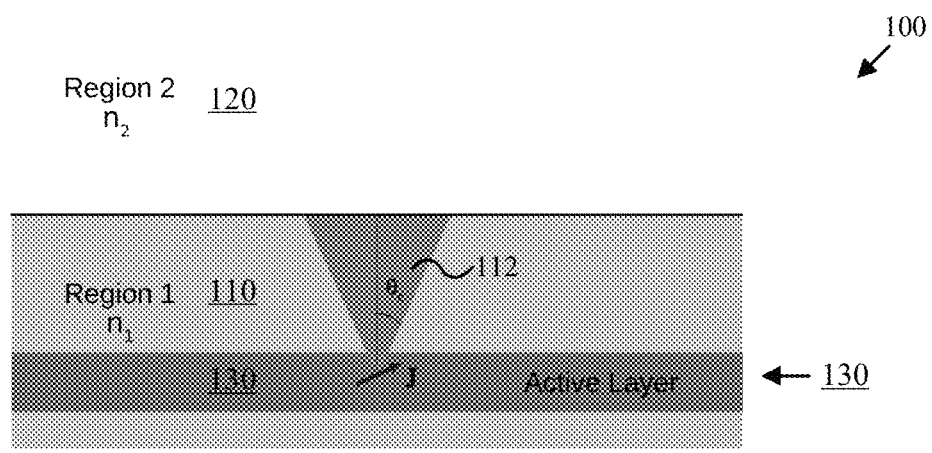
FIG. 1 is a schematic drawing that illustrates a simple physical model for light extraction from an LED.

The embodiments disclosed herein recognize that evanescent energy associated with a propagating wave within a medium may be at least partially released into the ambient environment when the propagating wave is reflected at an endpoint in the medium. This inventive insight has been leveraged to improve light extraction in an LED as follows.

Many solutions to the problem of light extraction exist, though not all are equally viable. For example, one common method is to immerse an entire LED within the center of an index-matched spherical ball. If treated with an antireflective coating, then all light generated by the device necessarily falls within an escape cone and radiates away. This is the central concept behind several prior publications, including US Patent Application #2008/0121918 A1, US Patent Application #2009/0121250, and U.S. Pat. No. 7,053,419 B1. Unfortunately, the index-matched ball also tends to manifest as a large, mechanical structure, and is therefore not necessarily a practical option for space-limited or distributed applications.

Another solution developed for the light extraction problem is the use of photonic crystals (see, for example, U.S. Pat. No. 7,294,862 B2 of David et al. 2007 and "Photonic crystal LEDs—designing light extraction," Laser & Photonic Reviews, vol. 3, no. 3, pp. 262-286, 2009). Photonic crystals (PCs) are structures that attempt to guide the flow of light through the use of a periodic lattice of dielectric elements. When the film region of a device is very small, the propagation of trapped light tends to fall into a discrete spectrum of allowed modes. Proper engineering of the PC lattice can exploit this fact by deliberately coupling the crystal lattice with the allowed modes of the waveguide. PC designs have many advantages, such as the ability to shape the directivity of out-coupled light, or even preservation of the polarization of emitted photons. However, all of these advantages rely heavily on the film being thin enough to produce the discrete spectrum of guided modes. When manufacturing conditions force the film region to be greater than many wavelengths in thickness, the discrete modal structure of guided radiation breaks down into a virtual continuum. PC surfaces are therefore not always a viable option for light extraction, either.

Another common approach for improved light extraction is random surface roughening. Not only does random roughening have intrinsic antireflective properties, but it also has the advantage of breaking down the distinct escape cone exhibited by flat interfaces. Hence, any ray of light ray that strikes the surface from some arbitrary direction will still have some finite probability of exiting the device. When repeated over many reflections within the substrate, light extraction efficiency is limited only by the absorption coefficient of the bulk substrate itself. Unfortunately, not all material interfaces allow for an easy implementation of a truly random surface with controlled variance. Such limitations may be due to the lack of a simple method for growing a random texture with the given materials, or perhaps concern about damaging the p-n junction by grinding and polishing against the surfaces.

When randomized surface texturing is not an option, it still may be possible to use regular, ordered textures instead (see, for example, U.S. Pat. No. 5,779,924). As argued by Yablonovitch ("Statistical ray optics," Journal of the Optical Society of America, vol. 72, no. 7, pp. 899-907, 1982), even a periodic surface geometry can mimic the effects of a random topography if the incident light itself is sufficiently randomized. Such conditions are actually very common in LEDs, wherein the active region is distributed throughout a volume of randomly-radiating dipoles. Ordered texturing also has the advantage of being controllable down to a submicron scale through standard photolithographic techniques. Such precision thus removes any concerns over damage to the active region, and even allows the freedom to engineer specific surface geometries. However, it is not well-understood which texture geometries are ideal facilitators of light extraction, nor how to effectively engineer an optimal surface pattern. Not only must the surface efficiently extract light from the first-pass of the active region itself, but also the subsequent back-and-forth reflections between the top and bottom interfaces.

The embodiments disclosed herein recognize that what is needed is a surface pattern that facilitates light extraction while still preserving practical etch geometries under given material/photolithographic constraints.

A simple physical model 100 for light extraction from an LED is that of a planar dielectric interface between a high-index substrate and the ambient environment. Depicted in FIG. 1, a LED substrate 110 may be defined by an index of refraction n1 while the ambient environment 120 is given by the index n2. Within the substrate 110, a junction between doped p-type and n-type semiconductor or organic layers forms a thin, active region 130 where electrons and holes recombine to emit photons. When averaged over time, each recombination event is effectively independent of all others, and the entire ensemble becomes an incoherent superposition distributed throughout the active region.

From an electromagnetic perspective, each recombination event between an electron-hole pair can be thought of as a brief, dipole moment of current density J that radiates light at a specific frequency over a short interval in time. For many LED embodiments, the active layer is also placed very close to the surface such that reflection and transmission tend to take place within the near field of the dipoles. The bulk substrate is often comprised of an optically dense dielectric material with relatively high index of refraction (typically n1>2.5). As a result, total internal reflection (TIR) tends to trap light within the substrate rather than allow radiation to escape to the outside environment.

The effect of TIR may be modeled by using Snell's law, which states that the critical angle c for a lossless, nonmagnetic interface is $c=\sin^{-1}(n2/n1)$. As an example that will be repeatedly referred to herein, GaSb is a common material that is used to fabricate infrared LEDs based on cascaded superlattice heterostructures. However, GaSb also has an index of refraction of approximately n1=3.9 at a wavelength of 4.5 μm, thus implying an escape cone 112 with a critical angle $\theta_c=15$ degrees. The figure of merit for such an interface is called the light extraction efficiency (LEE), and is defined as the fraction of total radiated power that escapes to the target region.

Figure 2:
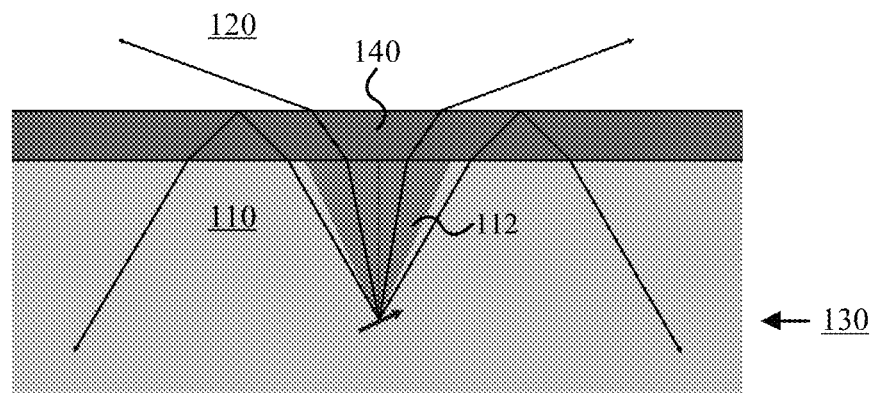
FIG. 2 is a schematic drawing that illustrates the effect of an anti-reflective coating on an LED.
Figure 3:
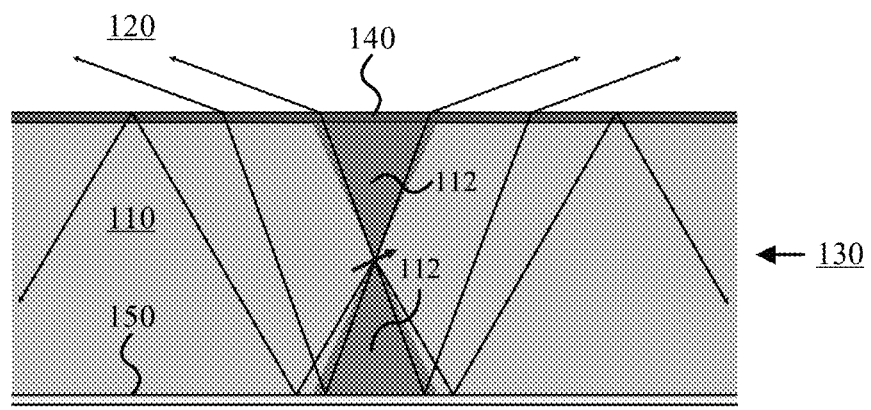
FIG. 3 is a schematic drawing that illustrates the effect of a reflective back coating on an LED.

Applying calculations from "Light extraction by directional sources within optically dense media," by Nagel, Optics Express, vol. 20, no. 25, pp. 27530-27541, 2012, which is incorporated herein by reference, the LEE of randomly-oriented dipole elements near the GaSb/air interface is limited to approximately 1.6%. One straightforward method to improve LEE is by applying an antireflective coating (ARC) 140 along the LED surface. Depicted in FIG. 2, the ARC 140 is a thin film of dielectric material that reduces Fresnel reflections within the escape cone 112. Another added benefit to the ARC is that it can often double as a passivation layer for the entire device surface. However, even if the ARC is perfectly engineered, Fresnel reflections are only minimized for ray angles that fall within the escape cone. For all rays beyond the escape cone 112, TIR is still present and continues to trap a large fraction of radiated light. Inclusion of an ARC on a GaSb substrate will therefore only marginally improve LEE up to a value of approximately 2.5%. Further improvement may be achieved by placing a reflective mirror at the back contact. Depicted in FIG. 3, a mirror 150 can be formed by deposition of a conductive metal with high reflectance. For many planar LED designs, the conductive metal is already a necessary feature when used as part of the back metal contact, and so fits naturally into the light extraction process. The advantage of a back mirror is that downward-propagating rays can escape from the top surface when they fall within the escape cone. However, extraction of the reflected rays also requires that attenuation within the bulk semiconductor layer be very weak. Otherwise, a significant fraction of light will be absorbed in the bulk layer as heat rather than extracted to the ambient environment. It is also necessary that the mirror possess a high reflectance value, which can vary with the specific choice of metal contact or the wavelength of incident light. Thus, even under ideal conditions, a back-contact mirror can only improve light extraction by a factor of two at most. LEE for a GaSb substrate is still therefore limited to only 5.0% with the back mirror.

Figure 4:
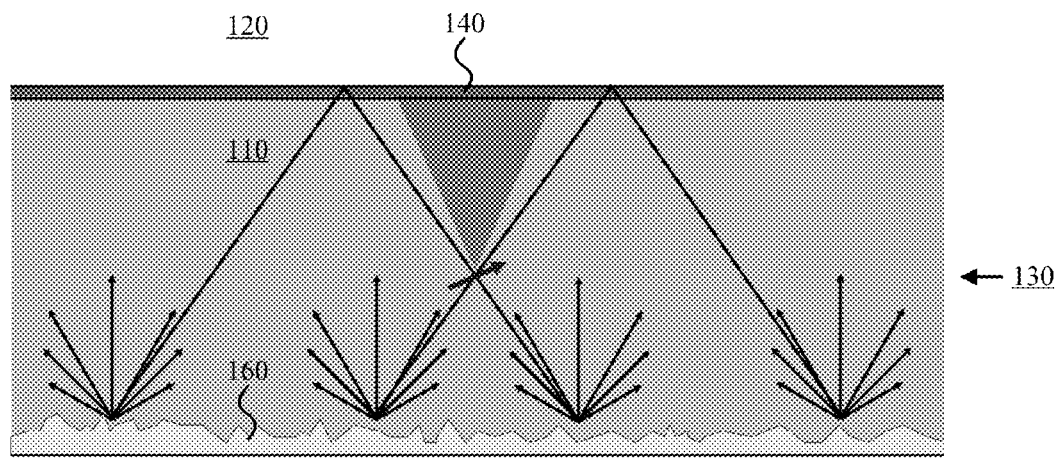
FIG. 4 is a schematic drawing that illustrates the effect of a textured reflective back coating on an LED.

To further improve light extraction in a planar LED structure, it is necessary to disrupt the planar symmetry of the bottom and top interfaces. When a planar interface is very flat and smooth, the reflection profile is said to be specular, meaning that the angle of reflection is always equal to the angle of incidence. If the top and bottom interfaces of an LED are both perfectly specular, then no light ray beyond the escape cone can ever find a path to the ambient environment. In contrast, when an interface is roughened with wavelength-scale deviations, reflected light tends to scatter over a wide distribution of angles rather than concentrate into a single ray. Surfaces that scatter light in this sense are called diffuse, with the limit to perfect uniformity called a Lambertian surface. When applied to the bottom metal surface, the result is depicted in FIG. 4, where each ray that strikes a textured bottom contact 160 is partially scattered back into the escape cone of the top surface. Thus, with a randomly-roughened back contact, the only limits to perfect light extraction are randomization of the reflected profile and bulk absorption within the substrate.

In principle, there are only two ways to reduce bulk absorption. Either the absorption coefficient of the substrate itself must be reduced, or the device thickness must be thinned. Since the material properties are generally predetermined by the semiconductor device itself, the only remaining option is to reduce the amount of bulk material between surfaces. Wafer grinding and polishing techniques therefore serve well as a method for substrate thinning. Given a proper choice of grit size with the grind, applicants assert is also possible to leave behind a randomized surface profile with a controlled surface variance.

Another fortunate side-effect of thinning the substrate is that it also tends to improve heat conduction away from the die and into the package, which can be highly beneficial to device performance. However, there are practical mechanical limits to how thin the wafer can be ground down and still successfully maintain integrity during the rest of the packaging process. Consequently, there will always remain some residual bulk absorption within the substrate, thus motivating the use of further surface engineering on the top interface.

Although surface roughening can be desirable at the top interface, grinding and polishing techniques may not be an option for generating a random surface profile. With the active region typically placed near the top interface (as, for example, with mid-infrared GaSb superlattice LEDs), grinding imposes a high risk of damaging the light emitting junctions and therefore cannot necessarily be used. Wet chemical etching can likewise work to randomize the profiles for some specific materials, but others, like GaSb, can only etch along regular profiles with current processes. Fabrication limitations may therefore require the top surface texturing to shape itself in regular, ordered geometries rather than a perfectly random topography.

Figure 5:
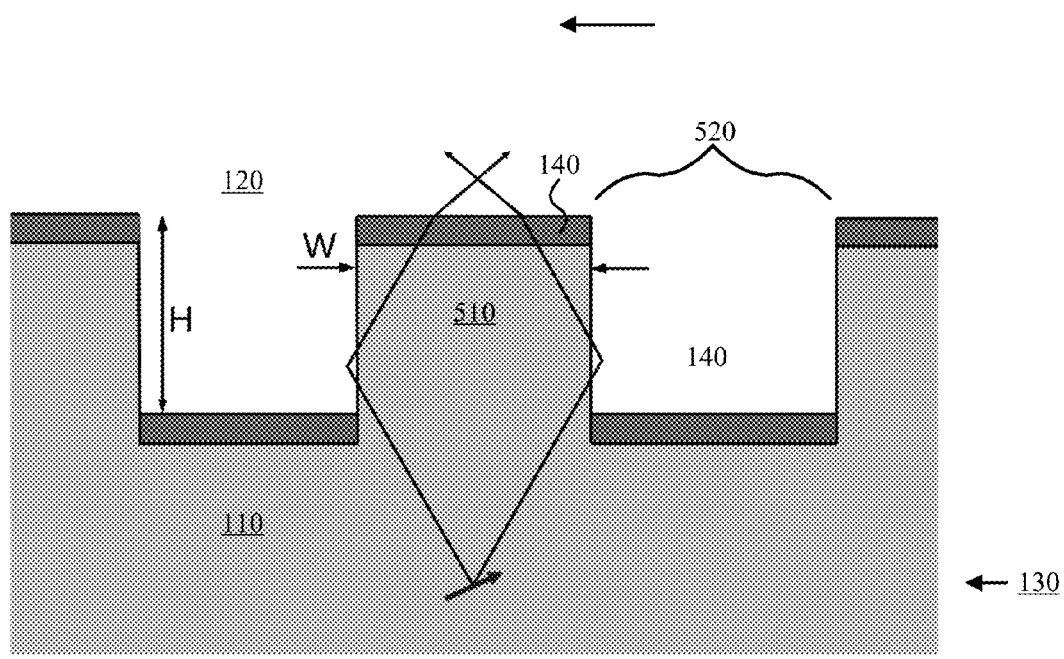
FIG. 5 is a schematic drawing depicting one embodiment of dielectric buttes in accordance with the present invention.

Fortunately, as noted earlier, many of the same benefits of a strictly random profile may be reasonably approximated by the use of ordered arrays. Given the random positions and polarizations of the emitting dipoles themselves, coupled with the random scattering from the back contact, even an ordered surface may still reflect and transmit in a Lambertian-like profile. One example of a basic surface feature is a rectangular butte 510 depicted in FIG. 5, which is defined by a characteristic height H and width W. From the perspective of a dipole element below, the butte tends to act as a funnel that couples incident light into a two-dimensional waveguide. However, not all light in a waveguide is contained perfectly within the waveguide walls. When a ray undergoes TIR at an interface, some small fraction of energy tends to penetrate the barrier in the form of an evanescent wave. When the interface is perfectly flat and infinite, then no real power physically escapes and the entire ray simply reflects back into the source region. In contrast, if the wave encounters a discontinuous boundary like the corner of the waveguide, then some energy trapped within the evanescent wave may freely radiate to the target region. With proper optimization, it is even possible to extract as much as 15% of the total radiated power on the first pass of light from a single dipole element within a GaSb substrate. Unfortunately, efficient light extraction of this scale can only be achieved with respect to a small, localized region directly underneath the butte. Since the active region is uniformly distributed over a relatively large volume, it is physically impossible to achieve the same scale of extraction efficiency over the entire ensemble at once. At best, one can merely attempt to optimize over the average of an ensemble of sources and then maximize the area coverage of the buttes.

The optimal choice of area coverage by the buttes is not an obvious parameter. For example, if a gap 520 between buttes were simply zero (i.e., 100% area coverage), the buttes would effectively meld together into a new, perfectly flat interface at some distance H above the original surface with no evanescent field. However, even if the gap is very small (typically less than 1/10th of a wavelength), light rays will still penetrate the barrier via evanescent wave coupling (also called frustrated total internal reflection). Applicants therefore assert that the ideal gap between buttes is approximately just outside of the evanescent decay length where evanescent wave coupling is weak, but area coverage is very high. To verify this hypothesis, applicants have utilized numerical simulations that average over an ensemble of embedded, incoherent sources.

Applicants also assert that the height and width of the buttes are likewise important parameters. A useful rule is that H and W must both be greater than 0.25 wavelengths and less than 2.0 wavelengths in order to effectively scatter light and facilitate extraction. It is also not crucial for the buttes themselves to be perfect, square blocks, though such shapes may be preferable out of simplicity or ease of fabrication. For example, further embodiments of the surface features may include hexagons, cylinders, and pyramids, with similar light extraction results.

Figure 6A:
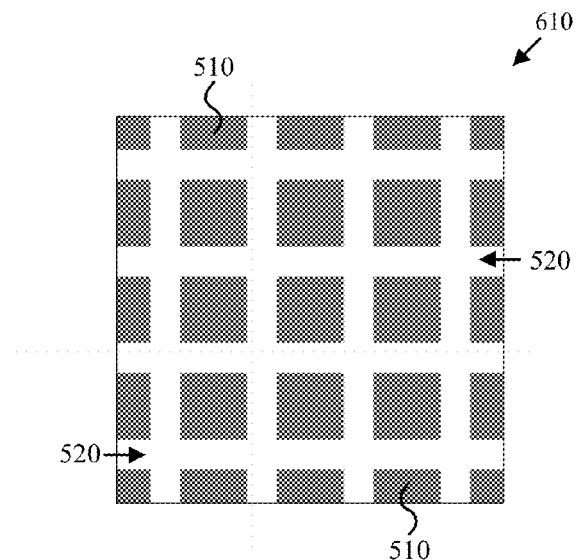
FIG. 6A is a top view layout diagram of a square lattice of buttes in accordance with the present invention.
Figure 6B:
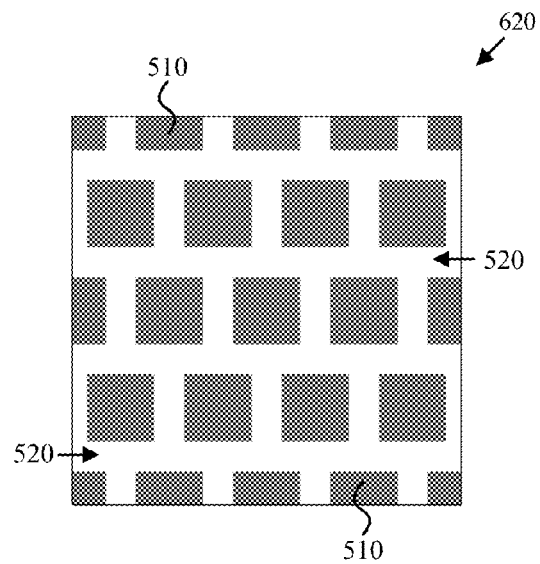
FIG. 6B is a top view layout diagram of a hexagonal lattice of buttes in accordance with the present invention.

In some embodiments, a collection of dielectric buttes is distributed on a top surface of the substrate and randomly or periodically spaced to provide weak electromagnetic coupling between adjacent buttes over an operating wavelength range for the junction. Weak electromagnetic coupling corresponds to spacings that provide good area coverage for the buttes while reducing frustrated total internal reflection (i.e., coupling) between them. For example, lattice arrangement of the buttes may be used where the buttes are densely packed within the weakly-coupled regime (e.g., greater than approximately one and less than approximately 3 evanescent field decay lengths) between buttes in order to maximize area coverage. However, it is also useful to arrange the lattice in such a way as to facilitate diffuse scattering. Since perfectly-ordered arrays tend to exhibit diffraction peaks in their reflection profile with respect to plane-wave incidence, it is useful to add layers of perturbation in the lattice geometry. Doing so will effectively add more diffraction peaks for a single plane wave of incidence, which better approximates the desired Lambertian profile. For example, FIGS. 6A and 6B compare the square lattice 610 of buttes with a hexagonal lattice 620, with the hexagonal being a preferred arrangement.

Because the active layer may be electrically close to the top surface, it is necessary to take great care in fabricating the buttes without damaging the core of the device. In some embodiments, there may even likely exist a layer of conductive material used to facilitate current spreading. For example, a quantum interband GaSb cascaded superlattice LED design may be used that leverages a current-spreading layer comprised of a thin (less than 100 nm) layer of InAs along the surface. In one particular embodiment, a new layer of GaSb is epitaxially grown along the surface to the desired feature height H. Photolithography and chemical etching may then be used to carve out the gaps between buttes into a desirable geometry and lattice spacing. The InAs layer thus serves as a physical barrier against wet chemical etching and prevents damage to the active layers underneath.

Figure 7:
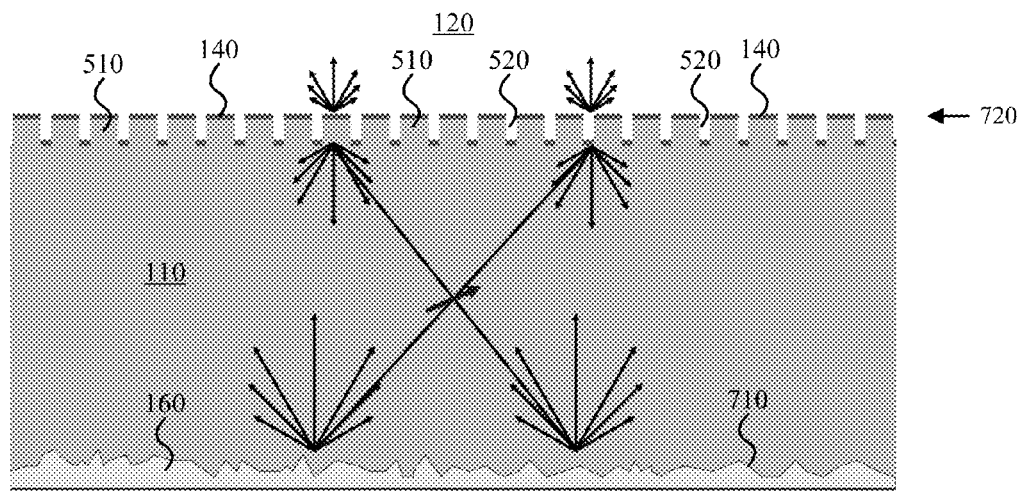
FIG. 7 is a schematic drawing depicting one embodiment of an LED structure in accordance with the present invention.

An example of one embodiment for the LED structure is depicted in FIG. 7. The bottom surface 710 has been randomly roughened (e.g., by wafer lapping/polishing during the thinning process) and then coated with a reflective metal contact 160. The top surface has further been etched with a lattice of weakly-coupled buttes 510, then treated with an ARC for improved transmission and passivation. The net result is a surface that efficiently extracts light from the active layers, both on the initial pass of light directly from the sources, as well as all subsequent back-and-forth reflections between interfaces. Note also that top-side metallization is an important step in this process and must be built into the surface patterning. However, area coverage by the top-side metallization is typically only 10% or less, and therefore generally negligible with respect to the design of light extraction features.

The collection of dielectric buttes 510 disposed on the top surface of the substrate may have a gap 520 between adjacent buttes that is greater than 0.1 wavelengths and less than 0.5 wavelengths. The dielectric buttes may be spaced to substantially maximize light extraction efficiency. In most embodiments, light extraction efficiency is maximized when the gap 520 between adjacent buttes is greater than 0.1 wavelengths and less than 0.7 wavelengths. In many embodiments, light extraction efficiency is maximized when the gap 520 between adjacent buttes is greater than 0.2 wavelengths and less than 0.5 wavelengths. Preferably, the dielectric buttes have a median width that is greater than 0.25 wavelengths and less than 2.0 wavelengths.

The collection of dielectric buttes may be spaced to provide weak waveguide coupling between adjacent buttes. In certain embodiments, the collection of dielectric buttes are spaced to maximize evanescent field radiation into the ambient environment. In some embodiments, the collection of dielectric buttes are spaced greater than one and less than three (1/e) decay lengths of an evanescent field generated by waveguided transmission within a butte. The collection of dielectric buttes, when sized and spaced as disclosed herein, may increase light extraction efficiency by at least 70 percent over a planar surface. In some embodiments, light extraction efficiency is increased by more the 95 percent over a planar surface.

Often times, the same device that functions well as an LED can also function reasonably well as a photo-detector. When employed as a photosensitive device, it is desirable to trap light within the LED substrate rather than extract it to the ambient environment. Due to reciprocity in electromagnetics, the embodiments presented herein that provide efficient light extraction may also be efficient mechanisms for light trapping. Thus, if the same device is intended for use as a detector of light rather than an emitter, the same features used to extract light can likewise serve to efficiently trap light and improve sensitivity.

It should also be understood that this description is not intended to limit the invention. On the contrary, the exemplary embodiments are intended to cover alternatives, modifications, and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An optoelectronic device, comprising:
    a substrate;
    at least one junction configured to provide an active region within the substrate;
    a metallic back contact;
    a collection of dielectric buttes disposed on a top surface of the substrate; and
    wherein the collection of dielectric buttes are spaced greater than approximately one and less than approximately three (1/e) decay lengths of an evanescent field that corresponds to waveguiding within a butte, over an operating wavelength range for the junction.

2. The device of claim 1, wherein the collection of dielectric buttes comprise a perturbed lattice.

3. The device of claim 1, wherein the substrate and dielectric buttes comprise III-V semiconductor compounds.

4. The device of claim 1, wherein the dielectric buttes are within a near-field distance of the active region.

5. The device of claim 1, wherein the dielectric buttes are rectangular, hexagonal, or circular cylinders.

6. The device of claim 1, wherein the dielectric buttes are arranged periodically into rectangular or hexagonal lattices.

7. The device of claim 1, wherein the dielectric buttes have a median width that is greater than 0.25 wavelengths and less than 2.0 wavelengths.

8. The device of claim 1, with wafer thinning to minimize bulk absorption.

9. The device of claim 1, further comprising a textured back surface contact configured to provide substantially diffuse scattering.

10. The device of claim 1, wherein the at least one junction is configured to emit light.

11. The device of claim 1, wherein the at least one junction is configured to absorb light.

12. The device of claim 1, further comprising an antireflective coating.

13. The device of claim 1, wherein the junction comprises a structure selected from the group consisting of a superlattice structure, a quantum well structure, a layered semiconductor alloy structure, an interband cascaded structure, and an intraband quantum cascaded structure.

14. The device of claim 1, wherein the junction comprises epitaxial GaSb adjacent to a current spreading layer of InAs.

15. The device of claim 1, wherein the dielectric buttes provide greater than 25 percent area coverage of the top surface of the substrate.

16. The device of claim 1, wherein the buttes improve light extraction efficiency by at least 70 percent over a planar surface.

17. An optoelectronic device, comprising:
a substrate;
at least one junction configured to provide an active region within the substrate;
a metallic back contact;
a collection of dielectric buttes disposed on a top surface of the substrate; and
wherein the collection of dielectric buttes provide greater than 25 percent area coverage of the top surface of the substrate; and
wherein the collection of dielectric buttes are spaced to substantially maximize light extraction over an operating wavelength range for the junction.

18. The device of claim 17, wherein the dielectric buttes have a median width that is greater than 0.25 wavelengths and less than 2.0 wavelengths.

\* \* \* \* \*